US006896729B2

(12) United States Patent
Liu et al.

(10) Patent No.: US 6,896,729 B2
(45) Date of Patent: May 24, 2005

(54) METHOD AND APPARATUS FOR GROWING SEMICONDUCTOR CRYSTALS WITH A RIGID SUPPORT WITH CARBON DOPING AND RESISTIVITY CONTROL AND THERMAL GRADIENT CONTROL

(75) Inventors: Xiao Gordon Liu, Fremont, CA (US); Wei Guo Liu, Sunnyvale, CA (US)

(73) Assignee: AXT, Inc., Fremont, CA (US)

( * ) Notice: Subject to any disclaimer, the term of this patent is extended or adjusted under 35 U.S.C. 154(b) by 78 days.

(21) Appl. No.: 10/190,001

(22) Filed: Jul. 3, 2002

(65) Prior Publication Data

US 2003/0037721 A1 Feb. 27, 2003

Related U.S. Application Data

(60) Provisional application No. 60/303,189, filed on Jul. 5, 2001.

(51) Int. Cl.[7] .............................................. C30B 11/06
(52) U.S. Cl. ............................. 117/81; 117/82; 117/83; 117/223
(58) Field of Search .............................. 117/81, 82, 83, 117/223

(56) References Cited

U.S. PATENT DOCUMENTS

| | | | | |
|---|---|---|---|---|
| 5,041,186 A | * | 8/1991 | Nishio et al. ............. | 117/15 |
| 5,514,903 A | | 5/1996 | Inoue et al. | |
| 5,639,299 A | | 6/1997 | Inoue et al. | |
| 6,007,622 A | | 12/1999 | Kawase et al. | |
| 6,045,767 A | | 4/2000 | Liu et al. | |

FOREIGN PATENT DOCUMENTS

| | | |
|---|---|---|
| JP | 64-37833 | 2/1989 |
| JP | 02034597 | * 2/1990 |
| JP | 10-167898 | 6/1998 |

OTHER PUBLICATIONS

Hanning et al., "Incorporation of carbon by VGF–Growth of GaAs", Crystal. res. Techonl. vol 34 No. 2 pp. 189–195 1999.*

N. Sato, M. Kakimoto, Y. Kadota, Semi–insulating III–V Materials, 1990, The carbon & boron concentration control in GaAs crystals grown by liquid encapsulated Czochralski method.

W.M. Higgins et al., Journal of Crystal Growth 174 (1997) 208–212, Active control of the electrical properties of semi-insulating GaAs.

H.D. Marshall and D.W. DeCuir, Journal of Crystal Growth, 110 (1991), 960–962, A novel technique to reduce the concentration of carbon in LEC gallium arsenide.

* cited by examiner

Primary Examiner—Robert Kunemund
(74) Attorney, Agent, or Firm—Jean C. Edwards, Esq.; Dickinson Wright PLLC

(57) ABSTRACT

Group III-V, II-VI and related monocrystalline compounds are grown with a rigid support of a sealed ampoule, carbon doping and resistivity control, and thermal gradient control in a crystal growth furnace. A support cylinder provides structural support for the combined sealed ampoule crucible assembly, while low-density insulating material inside the support cylinder deters convection and conduction heating. Radiation channels penetrating the low-density material provide pathways for radiation heating into and out of the seed well and transition regions of the crystal growth crucible. A hollow core in the insulation material directly beneath the seed well provides cooling in the center of the growing crystal, which enables uniform, level growth of the crystal ingot and a flat crystal-melt interface which results in crystal wafers with uniform electrical properties.

27 Claims, 7 Drawing Sheets

METHOD AND APPARATUS FOR GROWING SEMICONDUCTOR CRYSTALS WITH A RIGID SUPPORT WITH CARBON DOPING AND RESISTIVITY CONTROL AND THERMAL GRADIENT CONTROL

REFERENCE TO EARLIER-FILED APPLICATION

This application claims the benefit of U.S. Provisional Application No. 60/303,189, entitled "Non-Contact Carbon Doping and Resistivity Control in Growth of Gallium Arsenide," filed Jul. 5, 2001.

FIELD OF INVENTION

The present invention relates generally to the growth of Group III-V, II-VI and related monocrystalline compounds. More particularly, it relates to a method and apparatus for growing such compounds with a rigid support, carbon doping and resistivity control, and a thermal gradient control.

BACKGROUND OF INVENTION

Electronic and opto-electronic device manufacturers routinely require commercially grown, large and uniform single semiconductor crystals which, sliced and polished, provide substrates for microelectronic device production. The growth of a semiconductor crystal involves heating polycrystalline raw material to its melting point (in excess of 1,200° C.), bringing the melt into contact with a high quality seed crystal, and allowing the crystallization of the melt. This allows the formation of an essentially cylindrical crystal along a vertical axis with the seed crystal below the polycrystalline raw materials. The equipment necessary to form the semiconductor crystal includes a crystal growth furnace, an ampoule, a crucible, and a crucibles support. The crucible has a lower, narrow portion, called a seed well.

Several problems exist with the conventional crystal growth process and crystal growth equipment. First, controlled incorporation of a dopant such as carbon is often a key factor in the successful growth of semiconductor crystal, such as semi-insulating GaAs materials. Conventional techniques for growing semiconductor crystal, such as GaAs, have proved difficult to achieve controlled incorporation of carbon. These techniques generally involve doping of GaAs by placing a carbon-containing dopant in a GaAs melt and in contact with a molten charge.

Second, crystal growth equipment must be able to withstand extreme temperatures. In addition, the components of the apparatus need to have the rigidity and strength to hold the crucible and growing crystal still in spite of extreme turbulence and convection conditions that often exist within the system at times during crystal growth. Any shift, crack, or movement of a component of the crystal growth apparatus could result in a partial or total loss of the charge. At the same time of providing heat protection and rigidity, the crucible support cannot substantially block heat transfer to the crucible. In fact, precise control of a temperature gradient within the crucible is fundamental to many crystal growth technologies, and the crucible support should not obstruct or impede the heating of the crucible charge.

The temperature gradient control is important in producing a crystal that will yield substrates with uniform electrical properties, as it affects the flatness of the solid-melt interface in the growth process. In order to yield substrates with uniform electrical properties, the solid-melt interface should be as flat as possible. Maintaining the flat interface is difficult because the outer portions of the charge and apparatus tend to cool more readily than the center. For example, at high temperatures, the lower thermal conductivity of solid GaAs (0.7 W/cm.K) makes it more difficult to preserve the planarity of the liquid-solid interface, and slower growth rates are required. Because of the lower thermal conductivity of both liquid and solid GaAs relative to the crucible, the heat conducted by the crucible along the periphery of the ingot becomes more important in determining the interface shape in the conical transition region. As the crystal necks down toward a seed well and the cross section available for axial heat conduction diminishes, a radial temperature gradient arises and the solid-melt interface becomes concave. A method is needed to reduce this radial heat loss in the crucible support to form a flat solid-melt interface just above the seed.

Unless a controlled thermal gradient prevails through the lower, narrow portion of the crucible, nucleation defects, dislocation clusters, lineages, poly-crystal and twin defects tend to form in the transition region. Problems formed in the lower portion of the crucible propagate through the crystal as crystallization progresses up through the charge. On the other hand, if high quality crystal growth successfully extends into the larger diameter portion of the crucible, there is a low tendency of crystal defect formation. Therefore, the ability to control incorporation of a dopant, the quality of temperature control, and the ability to control the vertical temperature gradient and to maintain planar isotherms near the bottom of the apparatus directly affect overall crystal quality and crystal production yield.

In terms of the crucible support and the temperature control gradient, a wide range of solutions is practiced in the industry. Many conventional crucible support solutions involve a solid ceramic structure that might be vented to promote heat transfer by convection or conduction. In general, solid ceramic crucible supports provide effective heat insulation but offer poor temperature control in the lower portions of the crucible. While the strength and stability requirements suggest the need for a solid structure, the heating needs of the furnace in the area of the crucible seed well impose other considerations. A solid ceramic support is inherently unstable because as it expands and contracts, it can crack or shift. Further, the crucible support should not obstruct the flow of heat energy to the raw materials and crystal melt. A solid crucible support would be required to transfer heat from the furnace heating elements to the ampoule and its contents by conduction. Unfortunately, conduction heating is difficult to control at high temperatures, and, in practice, is counterproductive to the creation of a precise, planar temperature gradient as required by many crystal growth technologies.

Similarly, convection heating of the seed well provides imperfect control of the seed well temperature and as a result, also compromises the precision of the temperature gradient in the transition zone of the crucible. Some conventional crucible support techniques, which emphasize heat transfer by convection airflow, form a crucible support from a number of pieces of ceramic rings and spacers. Just as a solid crucible support design detracts from temperature control, a technique based on convection heating by a gas or fluid would similarly fail to meet the specific temperature gradient control needs of most crystal growth technologies, such as Vertical Gradient Freeze ("VGF").

Conventional techniques based on convection and conduction heat transfer approach fail to provide both precisely controlled heating of the seed well as well as reliable physical stability suitable for volume crystal production.

SUMMARY OF INVENTION

Aspects of the present invention relate to the growth of Group III-V, II-VI and related monocrystalline compounds with a rigid support, carbon doping and resistivity control, and a thermal gradient control. In one embodiment, a semi-insulating gallium arsenide (GaAs) material is grown with controlled incorporation of carbon as a dopant. A crucible having a seed region/well and an ampoule having a lower region and an upper region are provided. A seed crystal is placed in the seed region/well inside the crucible. A GaAs raw material and a boric oxide (B2O3) material are loaded into the crucible. The crucible containing the seed crystal, GaAs raw material, and B2O3 material is then inserted into the ampoule, with a solid carbon substance provided in the lower region of the ampoule outside the crucible. The ampoule containing the solid carbon substance and the crucible is sealed under vacuum. The sealed ampoule is heated in a controlled manner causing the GaAs raw material to melt. The heat interacts with the solid carbon substance to produce a carbon gas, which interacts with the GaAs melt through the B2O3 material. The sealed ampoule is further cooled in a controlled manner.

In another embodiment, a crucible support is provided for crystal growth that offers ample strength and stability to hold the ampoule, crucible, and its contents in a furnace throughout the intense heating cycle. Such enables precise temperature control of the seed well. For example, stable support to a sealed quartz ampoule in a VGF system is achieved while enabling precise control of the seed well temperature through heat radiation. In one embodiment, the method of providing crucible support comprises providing a solid, thin-walled cylinder on the floor of a VGF crystal growth furnace, filling the interior of the cylinder with a low density insulating material, providing an axial hollow core in the center of the low density insulating material, setting a sealed ampoule within a crucible therein on top of the cylinder such that the hollow axial core receives the ampoule seed well and the ampoule is supported by the cylinder.

DETAILED DESCRIPTION

Figure 1:
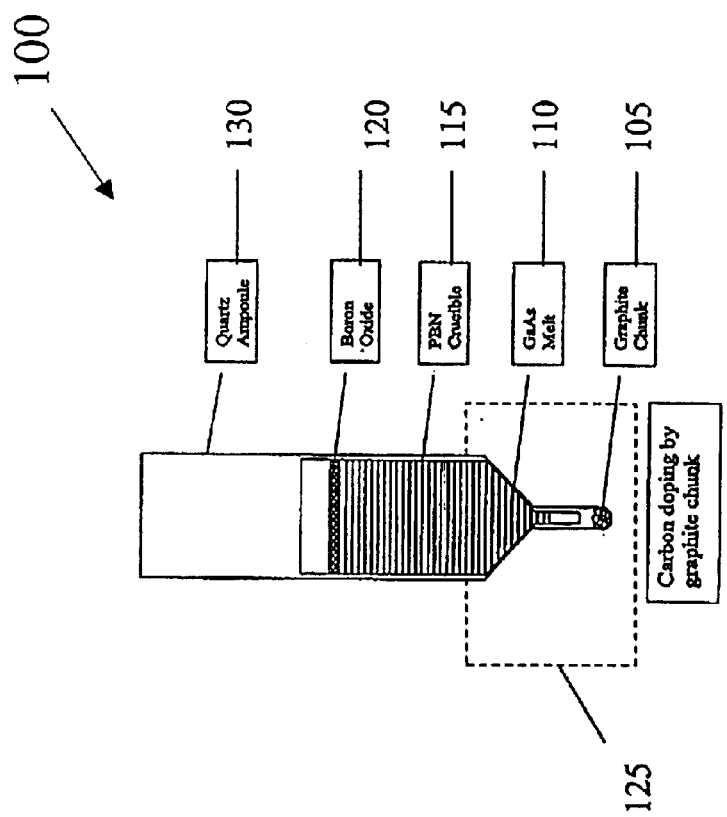
FIG. 1 shows a system 100 for providing non-contact carbon doping by graphite chunk and resistivity control in Vertical Gradient Freeze ("VGF") growth of GaAs, according to an exemplary embodiment of the present invention.
Figure 2:
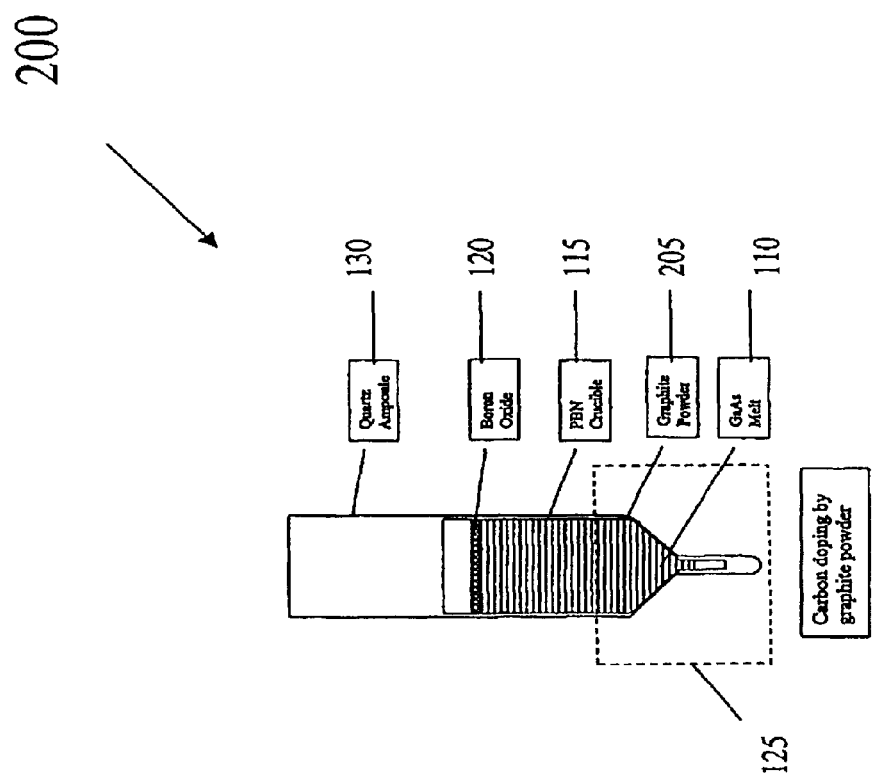
FIG. 2 shows a system 200 for providing non-contact carbon doping by graphite powder and resistivity control in Vertical Gradient Freeze ("VGF") growth of GaAs, according to an exemplary embodiment of the present invention.
Figure 3:
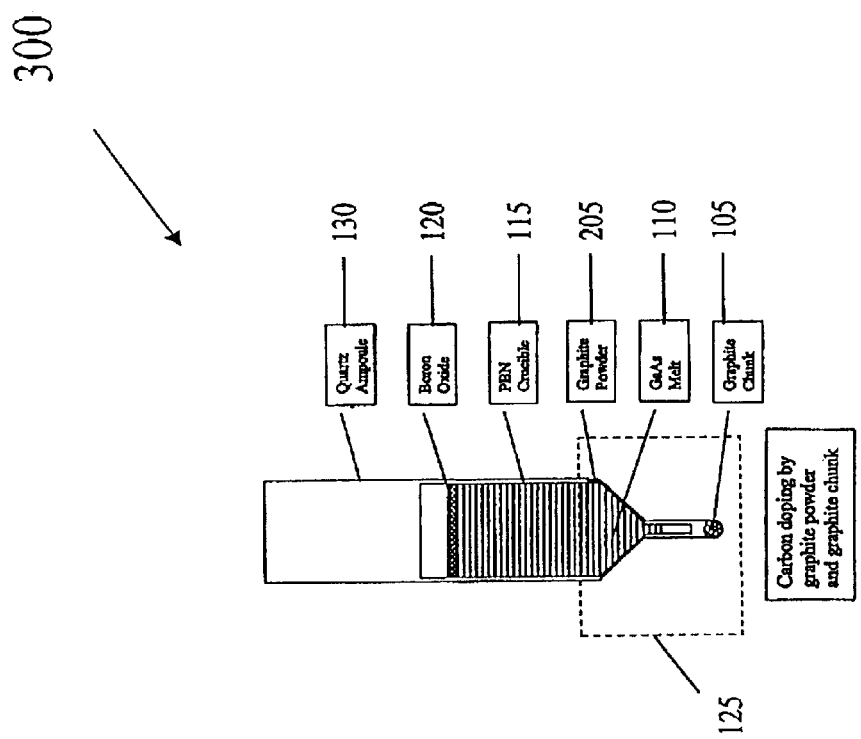
FIG. 3 shows a system 300 for providing non-contact carbon doping by graphite powder and graphite chunk and resistivity control in Vertical Gradient Freeze ("VGF") growth of GaAs, according to an exemplary embodiment of the present invention.
Figure 4:
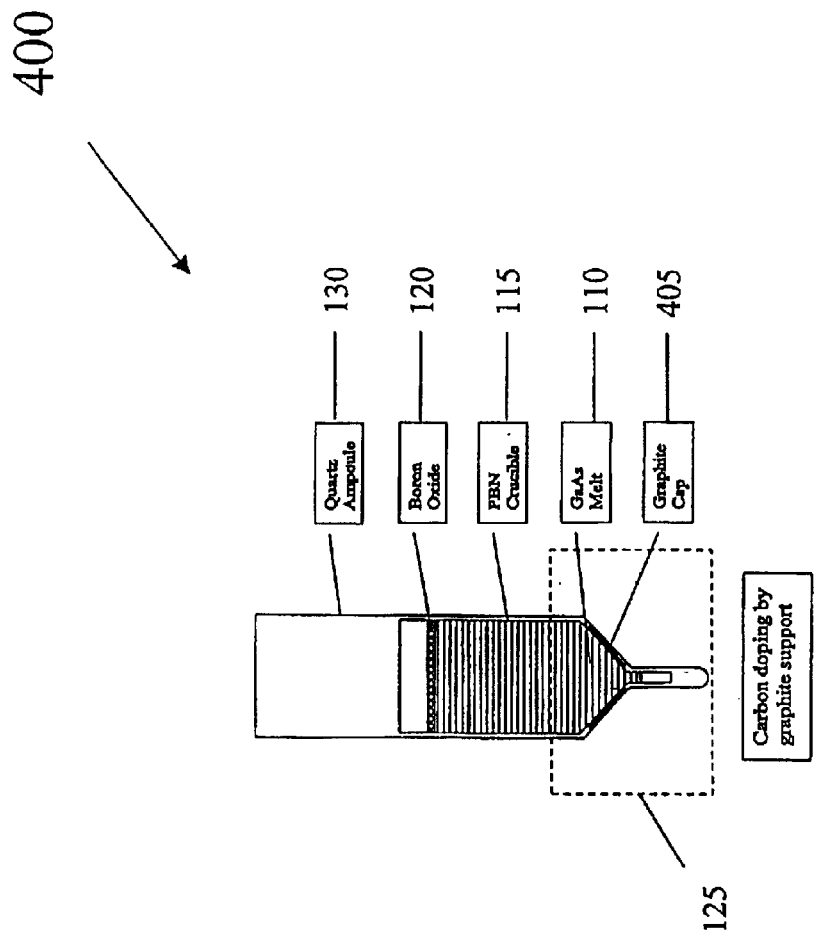
FIG. 4 shows a system 400 for providing non-contact carbon doping by graphite cap and resistivity control in Vertical Gradient Freeze ("VGF") growth of GaAs, according to an exemplary embodiment of the present invention.
Figure 5:
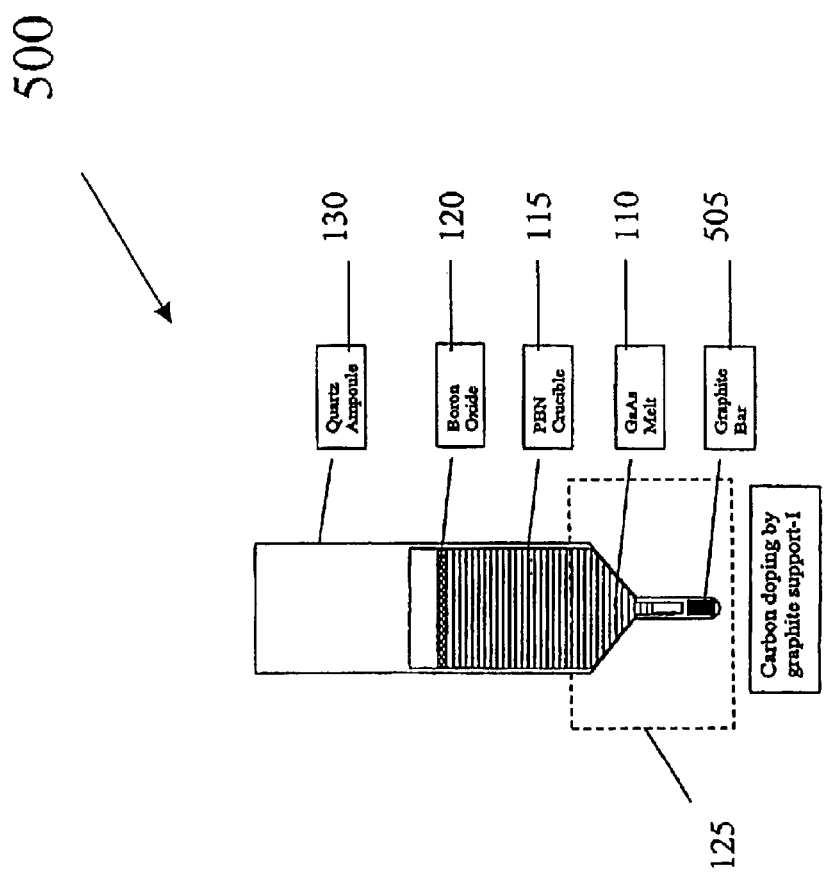
FIG. 5 shows a system 500 for providing non-contact carbon doping by graphite bar and resistivity control in Vertical Gradient Freeze ("VGF") growth of GaAs, according to an exemplary embodiment of the present invention.

Exemplary embodiments of the present invention generally relate to the growth of Group III-V, II-VI and related monocrystalline compounds in an environment with a rigid support, doping and resistivity control, and thermal gradient control. VGF growth of GaAs is used as an illustrative example, and embodiments of a method of carbon doping and resistivity control in a VGF growth process and a method of providing crucible support for use in a VGF growth furnace are described below.

VGF encompasses a crystal growth technology, apparatus, and process whereby large single crystal ingots are grown with a very high level of structural uniformity and low defect density. In one embodiment, the crystal ingots are essentially cylindrical with diameters greater than 4 inches and lengths greater than 6 inches. This essentially cylindrical crystal is grown along a vertical axis with the seed crystal below the polycrystalline raw materials.

In one embodiment, control of the carbon level and resistivity in semi-insulating GaAs is achieved by placing a dopant material outside a growth crucible, not in contact with the molten charge. Since the dopant materials are separated from the melt or the internal wall of the crucible, the process is favorable for achieving a high single crystal growth yield.

A process for achieving controlled incorporation of carbon in the growth of semi-insulating GaAs material, performed in accordance with exemplary embodiments of the present invention, is described with reference to FIGS. 1–5, and is as follows:

1. Carbon doping sources are provided. These dopants include, for instance, graphite chunk 105 in FIG. 1, graphite powder 205 in FIG. 2, a combination of graphite chunk 105 and graphite powder 205 in FIG. 3, graphite cap 405 in FIG. 4, graphite bar 505 in FIG. 5, and/or other small pieces of high purity bulk graphite.

2. In FIGS. 1–5, as in normal VGF growth, the initial charges of synthesized GaAs raw materials 110 are loaded into a pyrolytic boron nitride (PBN) crucible 115. Some boron oxide ("B2O3") 120 is also placed in the crucible 115.

3. The various carbon doping sources described above are placed at various locations generally at a low end 125 of a quartz ampoule 130, as shown in FIGS. 1–5. The PBN crucible 115 with the GaAs charges 110 is then loaded into the quartz ampoule 130.

4. The quartz ampoule 130 containing the dopant, the PBN crucible 115, the GaAs charges 110, and the B2O3 120, is then evacuated and sealed under a vacuum.

5. A crystal is grown by melting the charge 110, and then controlling the liquid-solid interface to travel from the seed at a low end of the PBN crucible 115 to the tail of the charge.

6. The resistivity and carbon level in the semi-insulating GaAs can be controlled by the amount of the dopant 105 used and the temperature of the dopant.

In FIGS. 1–5, the carbon doping source reacts with oxygen from decomposition of the boric oxide (B2O3) as described in N. Sato, M. Kakimoto, and Y. Kadota. "The carbon and boron concentration control in GaAs crystals grown by liquid encapsulated Czochralski method", in Semi-insulating III-V Materials, Toronto, Canada, 1990 IOP Publishing Ltd. (1990) pp. 211–219. This reaction produces Carbon Monoxide ("GO") and other carbon oxides which are effectively sealed in the quartz ampoule 130. The quartz ampoule 130 does not decompose significantly at the temperatures involved in GaAs crystal growth (below 1400 degrees Centigrade in this instance). The carbon oxides can be transported through the B2O3 120, as further described in "Active control of the electrical Properties of semi-insulating GaAs". by W. M. Higgins, R. M. Ware, M. S. Tieman, K. J. O'Hearn, and D. J. Carlson, J. Crystal Growth 174 (1997) pp. 208–212, resulting in the incorporation of carbon into the GaAs melt 110. The more carbon dopant is used and the higher the temperature of the carbon dopant, the more significant the reaction, hence the higher the carbon doping and resistivity (up to a maximum intrinsic value) of GaAs.

This contactless carbon doping can be used to reproducibly achieve semi-insulating properties of GaAs, resulting in resistivity ranging from low 1E6 to low 1E8 Ω-cm, with mobility higher than 6000 cm2/V.s. The technique also applies to other growth techniques in a sealed environment, such as Vertical Bridgeman ("VB").

Figure 6:
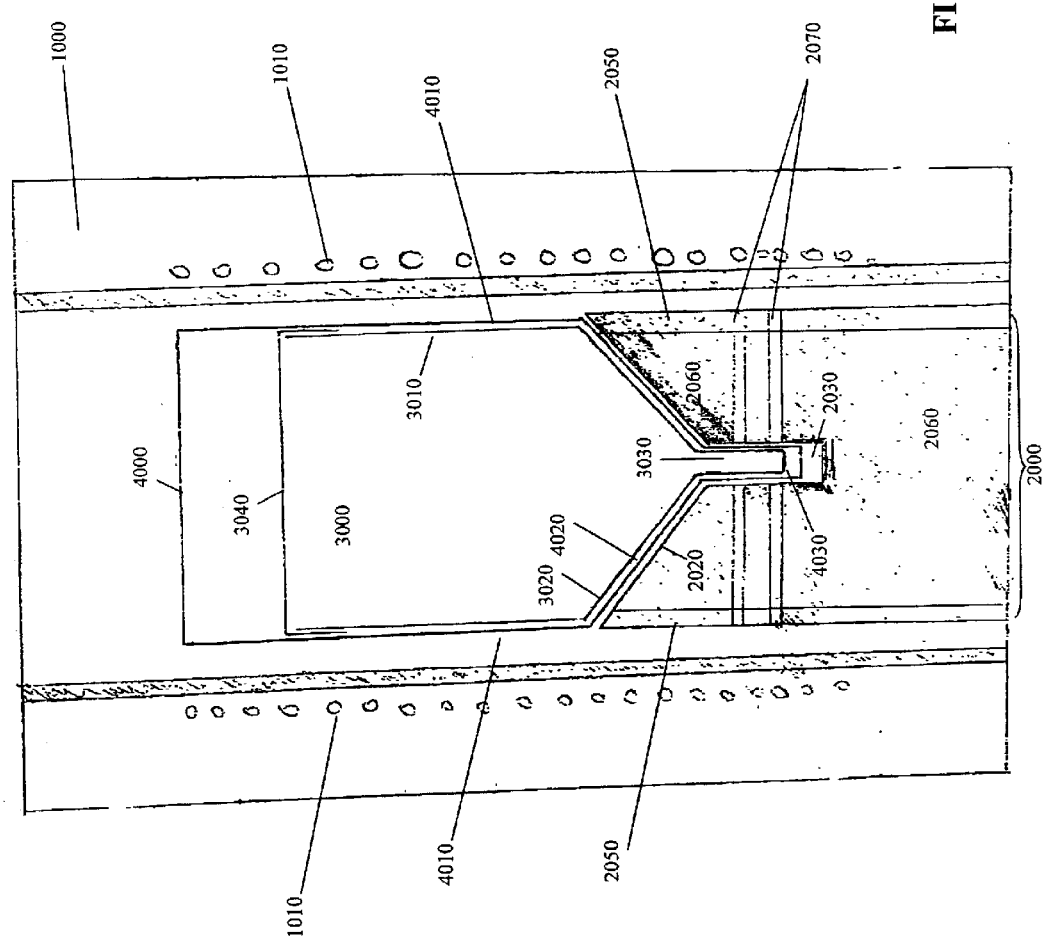
FIG. 6 illustrates a cross-sectional view of a Vertical Gradient Freeze ("VGF") growth system with a crucible support constructed according to an exemplary embodiment of the present invention.

FIG. 6 illustrates a cross-sectional view of a VGF growth system with a crucible support 2000 constructed according to an embodiment of the present invention. Any of the crucible-ampoule combination shown in FIGS. 1–5 or other kind of crucible-ampoule combination may rest on the crucible support 2000. The crucible support 2000 is depicted in a VGF furnace 1000. The crucible support 2000 provides physical support for and allows for thermal gradient control to the ampoule 4000 and its contents, including the raw material (not shown), seed crystal (not shown), and a crucible 3000.

In one embodiment, the crucible 3000 in which the raw materials melt and the crystal grows is a PBN structure with a cylindrical crystal growth zone 3010, a smaller diameter seed well cylinder 3030, and a tapered transition zone 3020. The crystal growth zone 3010 is open at the top of the crucible 3000 and has a diameter equal to the desired diameter of the crystal product. The current industry standard diameters are 4 and 6 inch wafers. At the bottom of the crucible 3000, the seed well cylinder 3030 has a closed bottom and a diameter slightly larger than that of the high quality seed crystal, e.g., about 6–25 mm, and a length on the order of 30–100 mm. Other dimensions may also be utilized. The major growth zone 3010 and the seed well cylinder 3030 may have straight walls or may taper outwardly on the order of one to a few degree to facilitate the removal of the crystal from the crucible 3000. The tapered transition zone 3020 between the growth zone 3010 and the seed well cylinder 3030 has an angled side wall pitched at approximately 45 degrees with a larger diameter equal to and connected to the growth zone wall and a narrower diameter equal to and connected to the seed well wall. The angled side wall may also be more steep or less steep than 45 degrees.

Before insertion in the VGF crystal growth furnace 1000, the crucible 3000 is loaded with raw materials, capped with a crucible cap 3040, and inserted in the ampoule 4000. The ampoule 4000 may, for example, be made of quartz. The ampoule 4000 has a shape similar to that of the crucible 3000. It is cylindrical in a seed growth region 4010, cylindrical with a narrower diameter in its seed well region 4030, and has a tapered transition region 4020 between the two regions. The crucible 3000 fits inside the ampoule 4000 with a narrow margin between them. The ampoule 4000 is closed at the bottom of its seed well region 4030, like the crucible, and sealed on top after the crucible and raw materials are loaded. The bottom of the ampoule 4000 has the same funnel shape as the crucible 3000.

Since the ampoule-crucible combination has a funnel shape, the crucible support 2000 is required to accommodate this funnel shape and hold the ampoule 4000 stable and upright inside the VGF furnace 1000. In other embodiment, the ampoule-crucible combination may retain a different shape, and the basic structure of the crucible support 2000 would be changed accordingly to fit the different shape. According to an embodiment of the present invention, stability and strength to the ampoule and its contents are provided through a solid, thin-walled cylinder 2050 of the crucible support 2000. The solid, thin-walled cylinder 2050 accommodates the funnel end of the ampoule structure 4000. In one embodiment, the crucible support cylinder 2050 is made of a heat conducting material, preferably quartz. In other embodiments, silicon carbide and ceramic may also be utilized to form the crucible support cylinder 2050. The cylinder 2050 makes a circle of contact with ampoule 4000, where the upper rim of the cylinder 2050 meets the shoulder of the ampoule's tapered region 4020. Such configuration leads to minimal solid-to-solid contact, which ensures that little or no undesirable, relatively uncontrollable heat conduction will transpire. As a result, heating is able to be generated by other, more controllable processes.

Low density insulating material 2060, such as ceramic fiber, fills the majority of the inside of the support cylinder 2050, with only a hollow axial core 2030 in approximately the center of the insulating material 2060 left empty to receive the seed well 4030 of the ampoule 4000. In other embodiments, the low-density insulating material may also comprise alumina fiber (1,800° C.), alumina-silica fiber (1,426° C.), and/or zirconia fiber (2,200° C.). The insulating material 2060 is carefully placed in the crucible support 2000. The weight of the ampoule 4000, as it sits on top of the cylinder 2050, pushes the insulating material 2060 down and forms the slanted insulating material edge 2020. Filling the majority of the cylinder interior with a low-density insulator reduces the flow of air, which ensures that little or no undesirable, relatively uncontrollable convection flow will take place. Like conduction, convection is an uncontrollable heat transfer method that works to the detriment of the VGF and other crystal growth process.

In the embodiment of FIG. 6, the hollow core 2030, with a diameter approximately equal to the ampoule seed well 4030, extends downward to a small distance below the bottom of the ampoule seed well 4030. In another embodiment, the hollow core 2030 extends through the crucible support from the bottom of the seed well to the bottom of the furnace apparatus 1000. The hollow core 2030 provides a cooling path from the center of the crystal. It contributes to cooling in the seed well and in the center of the growing crystal. With this construction, heat energy can escape down through the center of the solid crystal and seed, down through this hollow core 2030 in the insulating material 2060 within the crystal support 2000.

Without the hollow core 2030, the temperature of the center of the cooling ingot would naturally be higher than the crystal material nearer to the outer surface. In this case, the center of the ingot in any horizontal cross section would crystallize later after its perimeter had solidified. Crystals with uniform electrical properties cannot be made under these conditions. With the creation a hollow core 2030 included in the crystal support method, heat energy is conducted down through the bottom of the ampoule 4000 and the hollow core 2030 from where it radiates back out of radiation channels 2070. It is important to reduce heat energy from the center of the growing crystal so that the isothermal layers are kept flat across the crystal diameter.

Maintaining a flat crystal-melt interface allows the production of crystals with uniform electrical and physical properties.

The low-density insulating material 2060 within the cylinder 2050 obstructs the flow of heat radiation from the furnace heat elements 1010 to the ampoule 4000 in the seed well region 4030, so this method requires the creation of a plurality of horizontal radiation channels/openings/tunnels 2070 through the insulation material 2060. The radiation channels 2070 penetrate the insulating material 2060 to provide heat radiation outlets to controllably transfer heat from the furnace heating elements 1010 to the ampoule seed well 4030.

The number, shape and diameter of the radiation channels 2070 varies depending on specific conditions. The radiation channels may also be slanted, bent or wave-like. The radiation channels also do not necessary have to be continuous, as they may extend only partially through the insulating material 2060. This helps minimize convection currents. In one embodiment, the diameter of these channels is small, on the order of a pencil width, so that convection airflow is insignificant. Larger holes with cross-sectional area on the order of a square inch or more can also be used according to other embodiments of the invention. The radiation channels 2070 through the insulating material 2060 also work in conjunction with the hollow core 2030 in the center of the insulating material 2060 to radiate heat energy drawn from the center of the crystal, and cool the crystal with planar isothermal temperature gradient layers. The radiation channels 2070 enable temperature control and directly relate to crystal growth yield.

Figure 7:
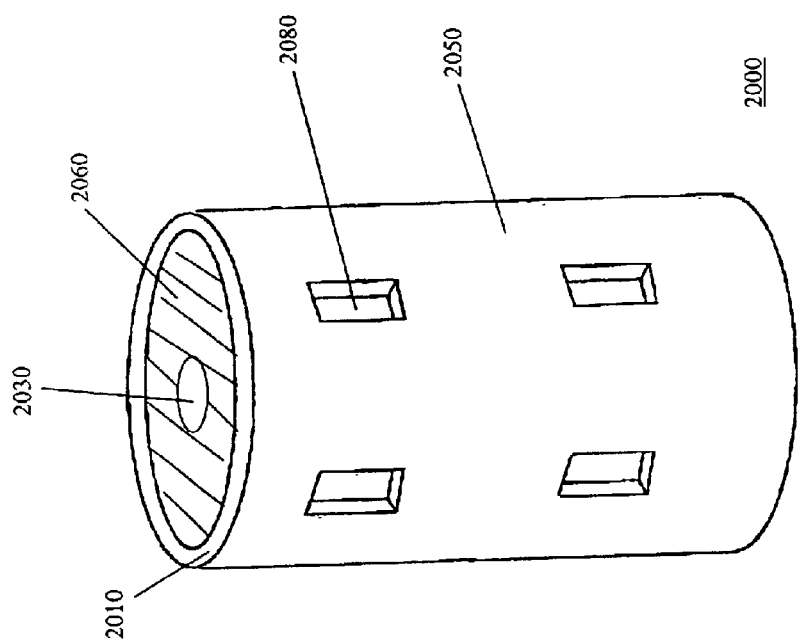
FIG. 7 illustrates a perspective view of a crucible support constructed according to an exemplary embodiment of the present invention.

FIG. 7 illustrates a perspective view of a crucible support 2000 constructed according to the present invention. The exterior view of the crucible support 2000 shows a support cylinder 2050, an upper rim 2100 of the support cylinder 2050, windows 2080, insulating material 2060 and hollow core 2030. The support cylinder 2050 provides support to an ampoule structure (not shown) with only minimal contact to the ampoule. The upper rim 2100 of the support cylinder 2050 contacts the ampoule in a circle, so conduction heating is minimal. The cylinder also forms a barrier to airflow, blocking convection currents that might otherwise develop in the radiation channels (not shown) that leads to windows 2080, while not blocking radiated heat. In other embodiments, the windows 2080 may also be the ends of the radiation channels. The small diameter of the radiation channels is another deterrent to convection airflow within the crucible support 2000.

Thus, supporting the ampoule and its contents with a support cylinder, filling the support cylinder with low density insulating material except at its central core, and penetrating the insulating material with heat radiation channels allow for thermal gradient control in crystal growth processes. Controlled heating and a level temperature gradient in the different stages of crystal growth are achieved. This temperature control is essential to VGF and other type of crystal growth because temperature control in both the crystal growth region and the seed crystal well of a crucible are important in establishing and controlling the temperature gradient in the transition region of the crucible. Precise temperature gradient control in the transition region of the crucible is essential to single-crystal yield of VGF and other type of growth process.

With conduction and convection minimized in the method of the current invention, the job of conveying heat energy from the furnace heating elements to the seed well in VGF under this method is left primarily to heat radiation. Heat radiation is the most effective method of heat transfer in the temperature range of crystal growth furnaces, about several hundred to more than 1,200° C., and heat radiation is the most desirable means of heating the ampoule and charge as it can be more carefully controlled than either convection or conduction. A support cylinder employed in this construction is transparent to heat radiation, so the support cylinder does not interfere with radiated heat transfer even while it contributes to the reduction of convection airflow as a solid barrier.

In view of the cumulative effect of these method features and refinements, embodiments of the present invention comprise crucible support techniques that contribute high stability to the VGF ampoule, crucible, and charge, while enabling efficient, precise temperature control of the ampoule seed well.

It should be emphasized that the above-described embodiments of the invention are merely possible examples of implementations set forth for a clear understanding of the principles of the invention. They are not intended to be exhaustive or to limit the invention to the precise forms disclosed. Variations and modifications may be made to the above-described embodiments of the invention without departing from the spirit and principles of the invention. For example, other crystal growth processes that create Group III-IV, II-VI and related moncrystalline compounds in a similar or equivalent fashion as the VGF growth process could also utilize embodiments of the carbon doping and resistivity control and/or embodiments of the rigid support with temperature gradient control. All such modifications and variations are intended to be included herein within the spirit and scope of the invention and protected by the following claims.

What is claimed is:

1. A method of growing a semi-insulating gallium arsenide (GaAs) material by controlled incorporation of carbon gas as a dopant, the method comprising the steps of:

providing a crucible having a seed region;

placing a seed crystal in the seed region inside the crucible;

loading a GaAs raw material into the crucible;

loading a boric oxide ($B_2O_3$) material into the crucible;

providing an ampoule having a lower region and an upper region;

providing the crucible containing the seed crystal, GaAs raw material, and $B_2O_3$ material, in the ampoule;

providing a solid carbon substance in the lower region of the ampoule outside the crucible;

sealing under vacuum the ampoule containing the solid carbon substance and the crucible; and heating the sealed ampoule in a controlled manner causing the GaAs raw material to melt, the heat interacting with the solid carbon substance to produce a carbon gas which interacts with the GaAs melt through the $B_2O_3$ material; and cooling the sealed ampoule in a controlled manner.

2. The method of claim 1 further comprising the step of: selecting a predetermined amount of the solid carbon substance.

3. The method of claim 1 wherein the solid carbon substance includes a graphite chunk.

4. The method of claim 1 wherein the solid carbon substance includes a graphite powder.

5. The method of claim 1 wherein the solid carbon substance includes a graphite cap.

6. The method of claim 1 wherein the solid carbon substance includes a graphite bar.

7. The method of claim 1 wherein the solid carbon substance includes a piece of graphite.

8. An apparatus for growing a semi-insulating gallium arsenide (GaAs) material by controlled incorporation of carbon gas as a dopant, the apparatus comprising:

a crucible having a seed region; and an ampoule having a lower region and an upper region, the crucible provided in the ampoule, a solid carbon substance provided in the lower region of the ampoule outside the crucible, the ampoule sealed under vacuum to contain the solid carbon substance and the crucible.

9. The apparatus of claim 8 wherein the solid carbon substance includes a graphite powder.

10. The apparatus of claim 8 wherein the solid carbon substance includes a piece of graphite.

11. A system for growing a semi-insulating gallium arsenide (GaAs) material by controlled incorporation of carbon gas as a dopant, the system comprising:

a crucible having a seed region with a seed crystal in the seed region, the crucible containing a GaAs raw material and a boric oxide ($B_2O_3$) material;

an ampoule having a lower region and an upper region, the crucible provided in the ampoule, a solid carbon substance provided in the lower region of the ampoule outside the crucible, the ampoule sealed under vacuum to contain the solid carbon substance and the crucible; and a heating unit disposed about the ampoule.

12. The system of claim 11 wherein the solid carbon substance includes a graphite powder.

13. The system of claim 11 wherein the solid carbon substance includes a piece of graphite.

14. A method of crucible support comprising the steps of:

setting a solid cylinder on the floor of a VGF crystal growth furnace;

filling the solid cylinder with a low density material;

providing an axial hollow core in the center of the low density insulating material; and setting a sealed quartz ampoule containing the seed crystal, raw materials, crucible, and crucible cap in the top of the quartz cylinder such that the hollow axial core receives the ampoule seed well and the crucible is supported by the cylinder.

15. The method of crucible support of claim 14 wherein the low density insulating material is penetrated with a plurality of horizontal radial heat radiation channels before insertion in the solid crystal.

16. The method of crucible support of claim 14 in which the solid vertical cylinder is composed of quartz.

17. The method of crucible support of claim 14 in which the solid vertical cylinder is composed of silicon carbide.

18. The method of crucible support of claim 14 in which the solid vertical cylinder is ceramic.

19. The method of crucible support of claim 14 in which the low-density insulating material is ceramic fiber.

20. The method of crucible support of claim 14 in which the low-density insulating material is alumina fiber (1,800° C.).

21. The method of crucible support of claim 14 in which the low-density insulating material is alumina-silica fiber (1,426° C. ).

22. The method of crucible support of claim 14 in which the low-density insulating material is zirconia fiber (2,200° C.).

23. The method of crucible support of claim 15 in which the horizontal radial heat radiation channels has a cross sectional area equal to 1 square inch.

24. A crucible support apparatus comprising solid cylinder on the floor of a VGF crystal growth furnace, the solid cylinder filled with a low density material, an axial hollow core formed in the center of the low density insulating material, the hollow axial core receiving an ampoule seed well.

25. The method of claim 1, wherein said lower region is adjacent a seed well of said crucible.

26. The method of claim 8, wherein said lower region is adjacent a seed well of said crucible.

27. The method of claim 11, wherein said lower region is adjacent a seed well of said crucible.

* * * * *